United States Patent
Haga et al.

(10) Patent No.: US 8,053,285 B2
(45) Date of Patent: Nov. 8, 2011

(54) THERMALLY ENHANCED SINGLE INLINE PACKAGE (SIP)

(75) Inventors: Chris E Haga, McKinney, TX (US);
Anthony L Coyle, Plano, TX (US);
William D Boyd, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 73 days.

(21) Appl. No.: 12/565,976

(22) Filed: Sep. 24, 2009

(65) Prior Publication Data

US 2010/0015761 A1    Jan. 21, 2010

Related U.S. Application Data

(62) Division of application No. 11/656,689, filed on Jan. 23, 2007, now Pat. No. 7,612,437.

(51) Int. Cl.
*H01L 21/44* (2006.01)
*H01L 21/48* (2006.01)
*H01L 21/50* (2006.01)

(52) U.S. Cl. ............. 438/123; 438/617; 257/E23.031; 257/E51.02

(58) Field of Classification Search .......... 438/122, 438/123, 124, 125, 126, 127, 112, 666, 617, 438/660, E23.031, E23.036, E23.037, E23.043, 438/E23.047, E23.048, E23.05, E23.051, 438/E23.052, E31.117, E51.02
See application file for complete search history.

(56) References Cited

U.S. PATENT DOCUMENTS

| 6,608,369 B2 * | 8/2003 | Sone ............................ 257/676 |
| 2007/0194453 A1 * | 8/2007 | Chakraborty et al. ........ 257/777 |

* cited by examiner

*Primary Examiner* — A. Sefer
*Assistant Examiner* — Dilinh Nguyen
(74) *Attorney, Agent, or Firm* — Yingsheng Tung; Wade J. Brady, III; Frederick J. Telecky, Jr.

(57) ABSTRACT

In a method and system for fabricating a thermally enhanced semiconductor device (200, 300) is packaged as a through hole single inline package (SIP). A leadframe (210, 310, 410) having a die pad (220, 320, 420) to attach an IC die (230, 330), a first plurality of conductive leads (240, 340, 430) formed from a first portion of metal sheet (432), and a second portion of metal sheet (440) disposed on an opposite side of the IC die (230, 330) as the first plurality of conductive leads is stamped from a metal sheet. The first plurality of conductive leads (240, 340, 430) are arranged in a single line and are capable of being through hole mounted in accordance with the SIP. The second portion of metal sheet (440) includes the die pad (420) to form a heat spreader (260, 360) in the form of the metal sheet. The heat spreader (260, 360) provides heat dissipating for the heat generated by the IC die (230, 330).

13 Claims, 3 Drawing Sheets

THERMALLY ENHANCED SINGLE INLINE PACKAGE (SIP)

This application is a divisional of application Ser. No. 11/656,689, filed Jan. 23, 2007, the contents of which are herein incorporated by reference in its entirety.

BACKGROUND

The present invention is related in general to the field of semiconductor devices and more specifically to integrated circuit (IC) devices having a thermally enhanced package that is suitable for through hole mounting.

It is well known that IC packages used for through hole mounting applications include a single inline package (SIP) and a dual inline package (DIP). Many SIP and DIP IC packages may be limited in their capability to dissipate heat. It has been a common practice to add a thermally conductive metal plate to the SIP or DIP to dissipate the heat. The metal plate in the form of a heat sink, a heat slug, or a heat spreader is added to dissipate heat away from the heat source such as the IC to a heat sink to maintain thermal stability. FIG. 1 illustrates a view in perspective of a traditional SIP IC package 100 having a heat slug 110 that is capable of being attached to a heat sink (show shown), according to prior art. The traditional SIP IC package 100 includes a plurality of conductive leads 120 that are capable of being through hole mounted.

However, for manufacturing certain cost sensitive electronic equipment that utilizes through hole mounting technology, the traditional tools and methods for fabricating a SIP IC package having a metal plate to dissipate the heat may be inadequate to meet desired cost targets.

SUMMARY

Applicants recognize an existing need for a method and system for fabricating a semiconductor device that is packaged for being through hole mounted and that is capable of providing heat dissipation at desired costs compared to a traditional IC package having an added heat sink, absent the disadvantages found in the prior techniques discussed above.

The foregoing need is addressed by the teachings of the present disclosure, which relates to a system and method for fabricating a thermally enhanced semiconductor device packaged as a through hole single inline package (SIP) that is suitable for through hole mounting. A leadframe having a die pad to attach an IC die, a first plurality of conductive leads formed from a first portion of metal sheet, and a second portion of metal sheet disposed on an opposite side of the IC die as the first plurality of conductive leads is stamped from a metal sheet. The first plurality of conductive leads are arranged in a single line and capable of being through hole mounted in accordance with the SIP. The second portion of metal sheet includes the die pad to form a heat spreader in the form of the metal sheet. The heat spreader provides heat dissipating for the heat generated by the IC die. A plurality of bond wires are formed to electrically couple the IC die to the first plurality of conductive leads. A molding compound encapsulates the IC die, the die pad, at least a portion of the first plurality of conductive leads, at least a portion of the second portion of metal sheet, and the plurality of bond wires to fabricate the semiconductor device.

In one aspect of the disclosure, a method for fabricating a thermally enhanced semiconductor device includes stamping a leadframe from a metal sheet. The leadframe includes a die pad for attaching an IC die, a first portion of the metal sheet to form a first plurality of conductive leads capable of being through hole mounted, and a second portion of the metal sheet to form a heat spreader. The first and second portions of the metal sheet are separated by a gap and disposed on opposite sides of the IC die. At least a portion of the first portion of the metal sheet is removed to generate another gap between adjacent ones of the first plurality of conductive leads. The heat spreader is thermally coupled to the die pad and to a heat sink, thereby enabling transfer of heat generated by the IC die to the heat sink.

Several advantages are achieved by the method and system according to the illustrative embodiments presented herein. The embodiments advantageously provide a semiconductor device having a leadframe that is capable of not only providing a stable support base for securely attaching an IC die but is also advantageously capable of transferring heat from the IC die to a heat sink. The leadframe is thus advantageously structured to dissipate heat over a larger surface without having to add metal content used to form traditional heat slugs. Thus, the improved structure of the leadframe, which is based on a dual inline package concept and is capable of being manufactured using existing processes, achieves desired cost targets by reducing metal content compared to metal content of a traditional SIP package, each package having an equal number of conductive leads that are suitable for being through hole mounted.

DETAILED DESCRIPTION

Figure 1:
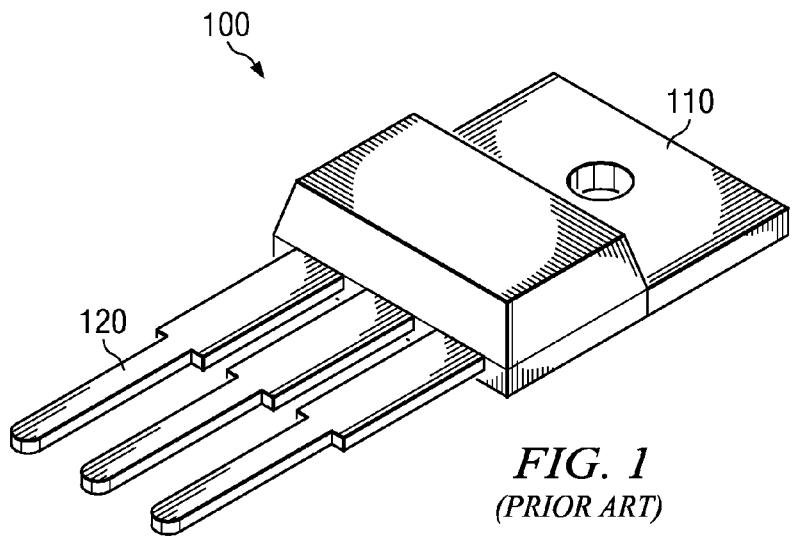
FIG. 1 illustrated herein above shows a view in perspective of a single inline package with a heat slug, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

For manufacturing certain cost sensitive electronic equipment that utilizes through hole mounting technology, traditional tools and methods may be inadequate to ensure that a SIP IC package having a heat slug for heat dissipation is within a desired cost target. As a result, improper heat dissipation in cost sensitive electronic equipment may lead to its failure or may result in the package exceeding its cost target. This problem may be addressed by an improved system and method for fabricating a thermally enhanced semiconductor device. According to an embodiment, in an improved system and method for fabricating a thermally enhanced semiconductor device is packaged as a through hole single inline package (SIP). A leadframe having a die pad to attach an IC die, a first plurality of conductive leads formed from a first portion of metal sheet, and a second portion of metal sheet disposed on an opposite side of the IC die as the first plurality of conductive leads is stamped from a metal sheet. The first plurality of conductive leads are arranged in a single line and are capable of being through hole mounted in accordance with the SIP. The second portion of metal sheet includes the die pad to form a heat spreader in the form of the metal sheet. The heat spreader provides heat dissipating for the heat generated by the IC die. A plurality of bond wires are formed to electrically couple the IC die to the first plurality of conductive leads. A molding compound encapsulates the IC die, the die pad, at least a portion of the first plurality of conductive leads, at least a portion of the second portion of metal sheet, and the plurality of bond wires to fabricate the semiconductor device.

The following terminology may be useful in understanding the present disclosure. It is to be understood that the terminology described herein is for the purpose of description and should not be regarded as limiting.

Leadframe—A leadframe is a conductive support or frame structure for securely attaching an integrated circuit (IC) chip or die during packaging and assembly of a semiconductor device. The leadframe typically includes a chip mount pad (also referred to as a die pad or die paddle) for attaching the IC chip, and a plurality of lead fingers or conductive segments to connect to external circuits. A gap between the ("inner") end of the lead fingers and the conductor pads on the IC surface are typically connected by thin metallic bond wires (typically made from gold, copper, aluminum or an alloy thereof), which are individually bonded to the IC contact pads and the lead fingers. The ends of the lead finger remote from the IC chip (referred to as "outer" ends) are electrically and mechanically connected to external circuitry. The packaging and assembly also includes encapsulating the IC chip, the bond wires, and at least a portion of the conductive segments by a polymeric or molding compound.

Semiconductor Package (or Package)—A semiconductor package provides the physical and electrical interface to at least one integrated circuit (IC) or die included in a semiconductor device for connecting the IC to external circuits. The package protects the IC from damage, contamination, and stress that result from factors such as handling, heating, and cooling. A single inline package (SIP) is a type of semiconductor device package having a plurality of connecting pins arranged in a single row or line. The SIP is generally suitable for through hole mounting.

Semiconductor Device—A semiconductor device is an electronic component that utilizes electronic properties of semiconductor materials to perform a desired function. A semiconductor device may be manufactured as a single discrete device or as one or more ICs packaged into a module.

The structure and fabrication of a thermally enhanced semiconductor device is described with reference to FIGS. 2, 3, 4, and 5.

Figure 2:
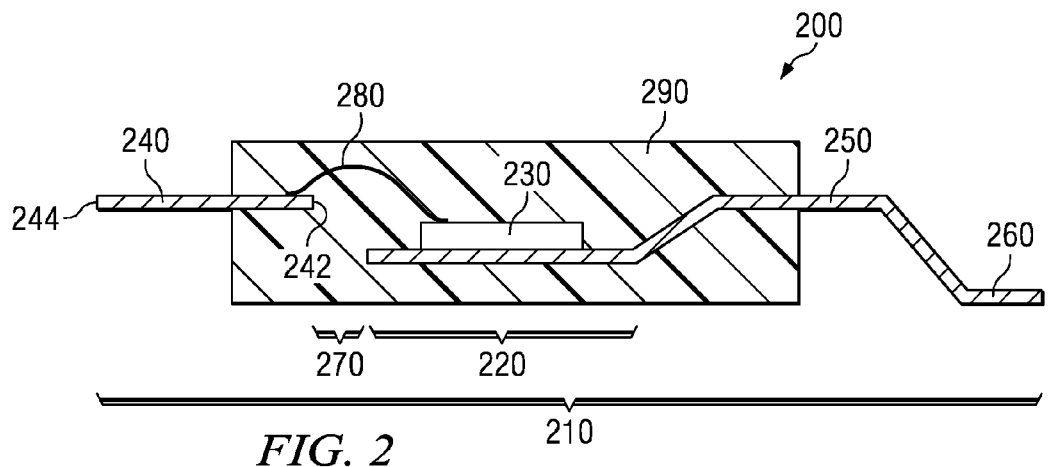
FIG. 2 illustrates a simplified and schematic cross section of a thermally enhanced semiconductor device, according to an embodiment.

FIG. 2 illustrates a simplified and schematic cross section of a thermally enhanced semiconductor device 200, according to an embodiment. The semiconductor device 200 includes a leadframe 210 that is stamped (may also be punched or etched) from a thermally and electrically conductive material such as a metal sheet (not shown). In the depicted embodiment, the leadframe 210 includes a base structure having a die pad 220 to attach an IC die 230 with a die attach compound, a first plurality of conductive leads 240 formed from a first portion of the metal sheet and capable of being through hole mounted, and a second portion of metal sheet 250 disposed on an opposite side of the IC die 230 as the first plurality of conductive leads 240. A number or quantity of the first plurality of conductive leads 240 may vary by application. The second portion of metal sheet 250 includes the die pad 220 to form a heat spreader 260. The die pad 220 may be included by simply not stamping the metal sheet to form the heat spreader 260. The heat spreader 260 that is in the form of the metal sheet may be flexibly shaped, bent or contoured to dissipate heat by itself and may also be thermally coupled to an optional heat sink (not shown) to improve the heat dissipation. For example, the heat spreader 260 may be oriented vertically and attached to the heat sink such as a chassis. Thus, the heat spreader 260 provides thermal coupling between a heat source, e.g., the IC die 230, and the heat sink to dissipate heat and maintain thermal stability. Each one of the first plurality of conductive leads 240 has an inner end 242 and an outer end 244. The outer end 244 is suitable for through hole mounting, e.g., may be inserted in a hole drilled in a printed circuit board (not shown) for being electrically coupled to an external device. As described herein, through hole mounting (may also be spelled as "thru-hole"), typically refers to a mounting scheme used for electronic components that involves the use of pins or leads on the electronic components that are inserted into through holes drilled in a printed circuit board (PCB) and soldered to contact pads on an opposite side of the PCB. A gap 270 separates the inner end 242 from the die pad 220.

The metal sheet that is used to stamp the leadframe 210, and hence the heat spreader 260, is preferably made of copper or copper alloy. The heat spreader 260 and the first plurality of conductive leads 240 have an equal thickness. Other choices for the metal sheet may include brass, aluminum, an iron nickel alloy such as "Alloy 42", and invar. The thickness of the metal sheet may be in the range from about 100 to 600 micro meters, although thinner or thicker sheets may be possible. The leadframe 210 is not only capable of providing a stable support base for securely attaching the IC die 230 but it is also advantageously capable of transferring heat from the IC die 230 to the heat spreader 260, and to an optional heat sink. The leadframe 210 is thus advantageously structured to dissipate heat without having to add metal content required to form thicker traditional heat slugs. Thus, the improved structure of the leadframe 210, achieves desired cost targets by reducing metal content compared to metal content of the traditional SIP package 100, each package having an equal number of conductive leads that are suitable for being through hole mounted.

A plurality of bond wires 280 are provided across the gap 270 to electrically couple a contact pad of the IC die 230 to a corresponding one of the first plurality of conductive leads 240. The bond wires are generally fabricated from gold, but may also be fabricated from copper, aluminum, and alloys thereof. In the depicted embodiment, a molding compound 290 is used to encapsulate the semiconductor device 200, which includes the leadframe 210, the IC die 230, and the plurality of bond wires 280. The thermally enhanced semiconductor device 200 is thus packaged and fabricated similar to a plastic dual inline package (P-DIP) but is through hole mountable as a single inline package. The semiconductor device 200 may be packaged in selectable widths, such as 7.62 millimeters (300 mils) or 15.24 millimeters (600 mils), depending on the application.

In an embodiment, the IC die 230 is one of one of an analog-to-digital converter, a digital-to-analog converter, an audio amplifier chip (including Class AB and Class D audio amplifiers), an application specific integrated circuit, and a system-on-a-chip or a combination thereof.

Figure 3:
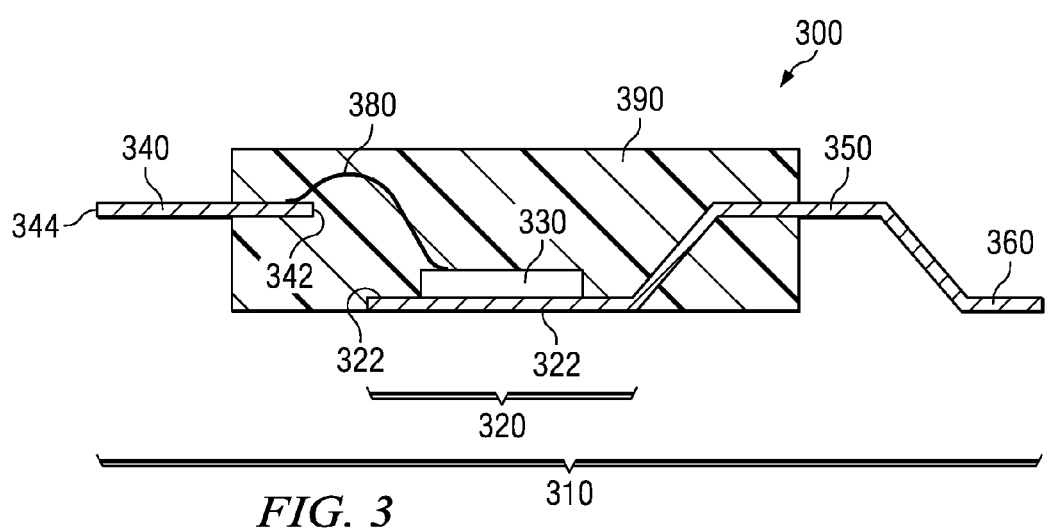
FIG. 3 illustrates a simplified and schematic cross section of a thermally enhanced semiconductor device with an exposed die pad, according to an embodiment.

FIG. 3 illustrates a simplified and schematic cross section of a thermally enhanced semiconductor device 300 with an exposed die pad, according to an embodiment. The semiconductor device 300 is identical to the semiconductor device 200 described with reference to FIG. 2 except for a disposition of a die pad 320 relative to a first plurality of conductive leads 340. Description for each of the elements of the semiconductor device 300 is substantially the same as those of the semiconductor device 200. In the depicted embodiment, a molding compound 390 encapsulates a portion of a top surface 322 of the die pad 320 and an IC die 330, leaving a bottom surface 322 of the die pad 320 exposed externally to dissipate heat. This is in contrast with the semiconductor device 200 in which the molding compound 290 completely encapsulates the die pad 220 without externally exposing its surface. The exposed die pad 320 of the semiconductor device 300 may further improve heat dissipation and enhance thermal stability.

Figure 4:
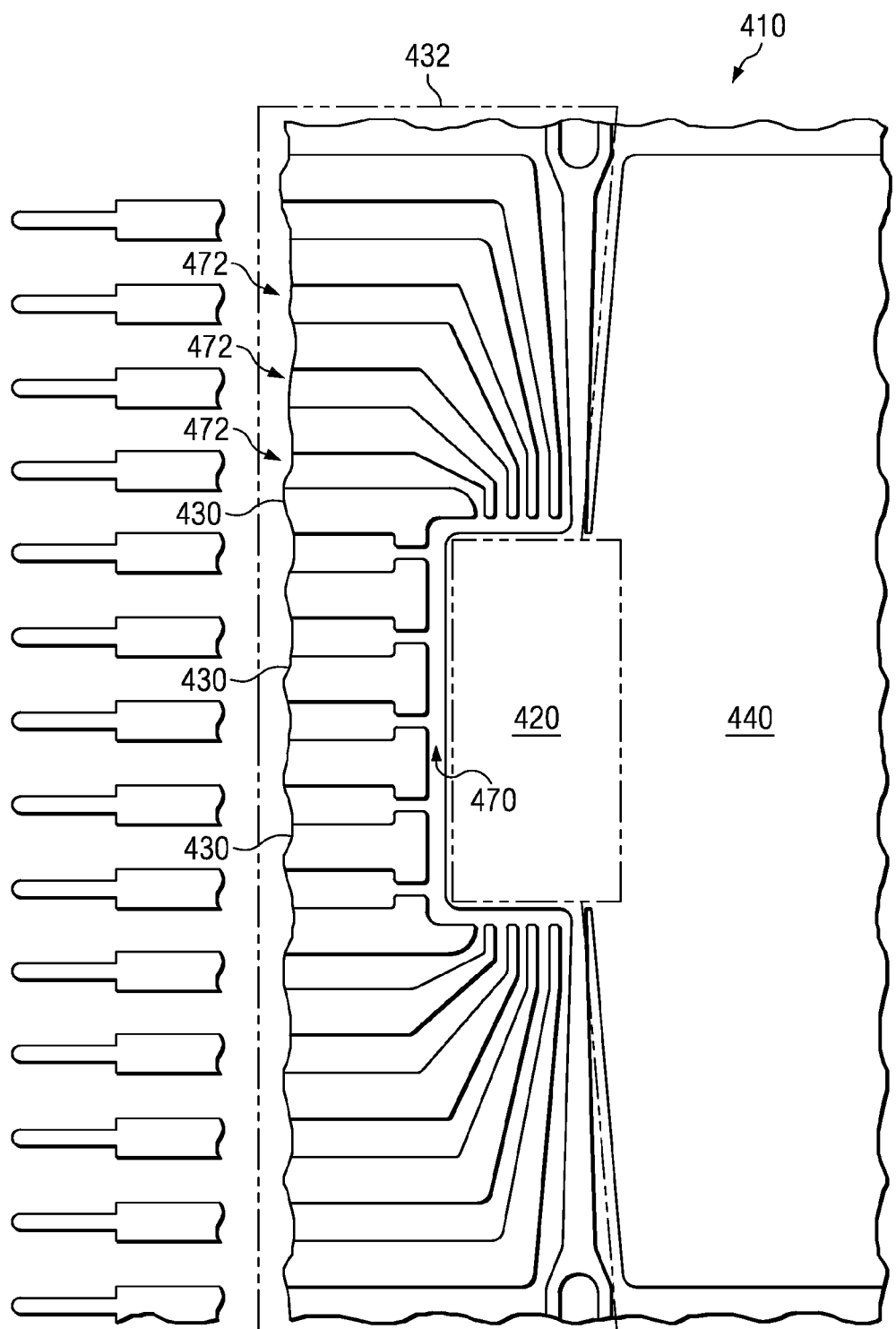
FIG. 4 illustrates a simplified and schematic view of a thermally enhanced leadframe, according to an embodiment.

FIG. 4 illustrates a simplified and schematic view of a thermally enhanced leadframe 400, according to an embodiment. The leadframe 410 is substantially the same as the leadframe 210 described with reference to FIG. 2 and the leadframe 310 described with reference to FIG. 3. The leadframe 410, which is stamped from a metal sheet, includes a first portion 432 of the metal sheet to form a first plurality of conductive leads 430 that are capable of being through hole mounted, and a second portion 440 of the metal sheet to from a heat spreader, e.g., the heat spreader 260 or the heat spreader 360. A surface area of the heat spreader is advantageously greater than surface area of a traditional SIP package 100, where the device and the traditional SIP package each have an equal number of the first plurality of conductive leads. The increased surface area coupled with the decreased metal content of the second portion 440 of the metal sheet improves thermal efficiency at reduced costs compared to the traditional solution. The first portion 432 and second portion 440 are separated by a gap 470. The second portion 440 includes a die pad 420. At least a portion of the first portion 432 of the metal sheet is removed (e.g., by stamping, punching or etching) during the metal sheet stamping process to generate another gap 472 between adjacent ones of the first plurality of conductive leads 430. As described earlier, the heat spreader may be optionally thermally coupled to a heat sink (not shown) to improve heat dissipation.

Figure 5:
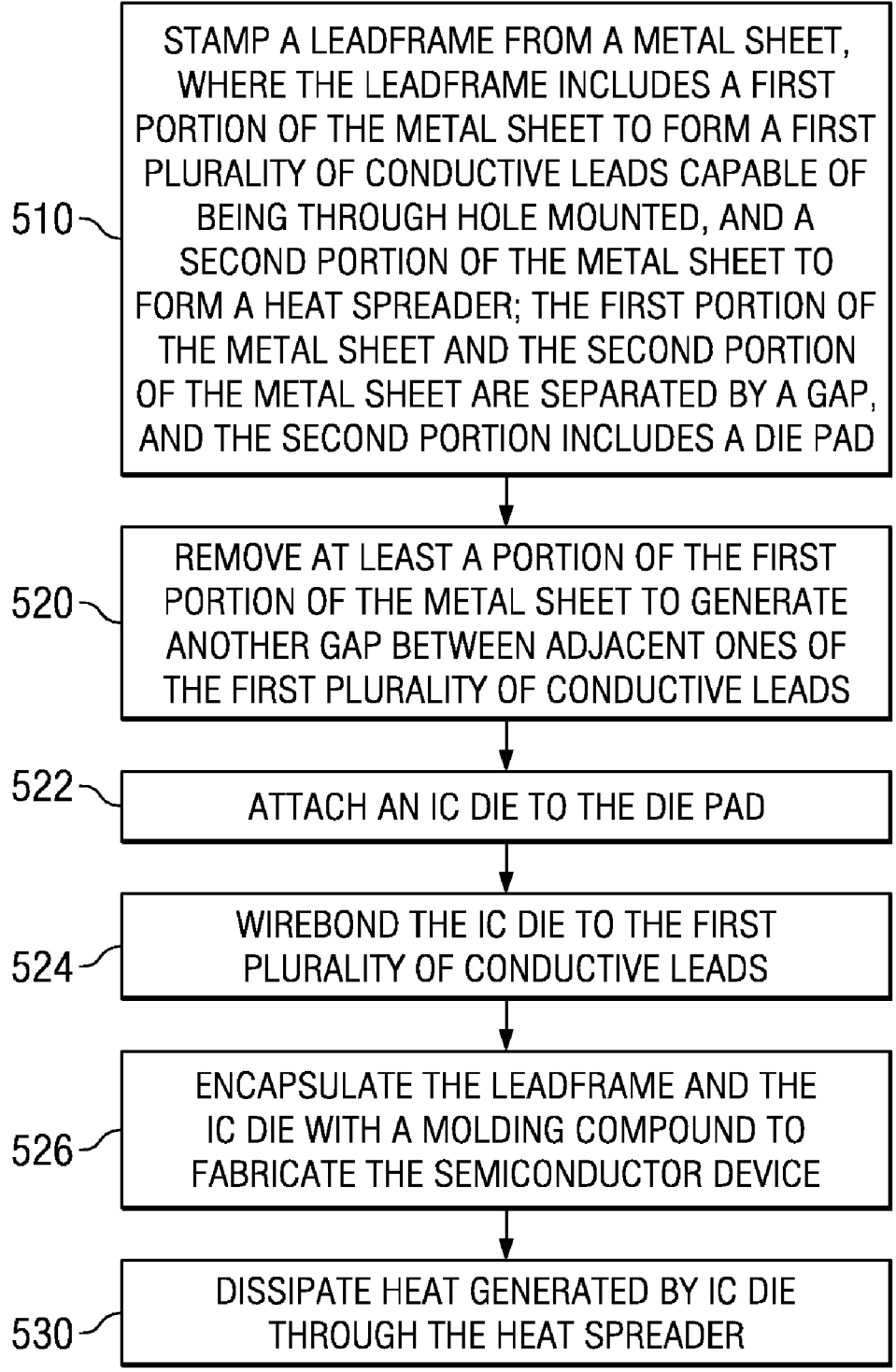
FIG. 5 is a flow chart illustrating a method for fabricating a semiconductor device, according to an embodiment.

FIG. 5 is a flow chart illustrating a method for fabricating a semiconductor device, according to an embodiment. In a particular embodiment, the semiconductor device is substantially the same as the semiconductor device 200 described with reference to FIG. 2, and the semiconductor device 300 described with reference to FIG. 3. At step 510, a leadframe, e.g., the leadframe 210, the leadframe 310, or the leadframe 410, is stamped from a metal sheet. The leadframe includes a first portion of the metal sheet to form a first plurality of conductive leads capable of being through hole mounted, and a second portion of the metal sheet to form a heat spreader. The first portion of the metal sheet and the second portion of the metal sheet are separated by a gap. The second portion includes a die pad. At step 520, at least a portion of the first portion of the metal sheet is removed (e.g., by stamping, punching, or etching) to generate another gap between adjacent ones of the first plurality of conductive leads. At step 530, the heat spreader is used to dissipate the heat generated by the IC die.

Various steps described above may be added, omitted, combined, altered, or performed in different orders. For example, steps 510 and 520 may be combined into one step. That is, the step of stamping also includes separating the first portion of the metal sheet into the first plurality of conductive leads. As another example, steps 522, 524, and 526 may be added before step 530. At step 522, an IC die is attached to the die pad. At step 524, the IC die is wirebonded to the first plurality of conductive leads. At step 526, the leadframe and the IC die is encapsulated with a molding compound to fabricate the semiconductor device. All of the above described steps for fabricating the semiconductor device advantageously use existing processes for fabricating plastic dual inline packages. As described earlier, the thermally enhanced semiconductor device 200 is packaged and fabricated similar to a plastic dual inline package (P-DIP) but is through hole mountable as a traditional single inline package. The thermally enhanced semiconductor device having P-DIP style packaging provides cost and volume advantages compared to the specialized SIP package equipped with an added heat slug.

Several advantages are achieved by the method and system according to the illustrative embodiments presented herein. The embodiments advantageously provide a semiconductor device having a leadframe structure that is capable of not only providing a stable support base for securely attaching an IC die but is also advantageously capable of transferring heat from the IC die to a heat spreader and an optional heat sink. The leadframe is thus advantageously structured to dissipate heat over a larger surface without having to add metal content used to form traditional heat slugs. Thus, the improved structure of the leadframe, which is capable of being manufactured using existing processes, achieves desired cost targets by reducing metal content compared to metal content of a traditional SIP package, each package having an equal number of conductive leads that are suitable for being through hole mounted.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of conventional mounting with wire bonding, those of ordinary skill in the art will appreciate that the processes disclosed are capable of being used for assembly of leadframe based semiconductor devices using different types of mounting techniques such as flip chip type mount.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for fabricating a semiconductor device comprising attaching a IC die to a die pad, which faces leads only at a front edge and at two side edges and has a rear side diverging into a heat spreader, which is more expansive than the die pad measured between the two side edges.

2. The method of claim 1, in which the die pad is separated from the leads by a gap that runs only along the front edge and the two side edges of the die pad.

3. The method of claim 1, further comprising encapsulating the IC die and a portion of the leads with a molding compound.

4. The method of claim 3, further comprising exposing a back surface of the die pad from the molding compound encapsulation.

5. The method of claim 1, further comprising wirebonding the IC die to the leads.

6. A method for fabricating a semiconductor device comprising attaching an IC die to a front portion of a sheet metal, which has a front edge of two side edges of a rectangle; and wherein the sheet metal has a rear portion more expansive than the front portion and converging into the front portion at the two side edges of the front portion.

7. The method of claim 6 further comprising wirebonding the IC die to leads.

8. The method of claim 7, in which the leads and the sheet metal are of the same thickness.

9. The method of claim 7, further comprising encapsulating the IC die and the bond wires with a molding compound.

10. The method of claim 9, further comprising exposing a surface of the sheet metal from the molding compound.

11. The method of claim 7, in which the semiconductor device is a DIP device.

12. The method of claim 6, in which all leads are in parallel.

13. The method of claim 12, in which the semiconductor device is a SIP device.

* * * * *